United States Patent
Chen et al.

(10) Patent No.: US 11,120,761 B2
(45) Date of Patent: Sep. 14, 2021

(54) DRIVING SUBSTRATE AND DISPLAY APPARATUS

(71) Applicant: E Ink Holdings Inc., Hsinchu (TW)

(72) Inventors: Wei-Tsung Chen, Hsinchu (TW);
Po-Hsin Lin, Hsinchu (TW);
Xue-Hung Tsai, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 16/161,075

(22) Filed: Oct. 16, 2018

(65) Prior Publication Data

US 2019/0122628 A1  Apr. 25, 2019

(30) Foreign Application Priority Data

Oct. 24, 2017  (TW) ................................. 106136423

(51) Int. Cl.
*G09G 3/36* (2006.01)
*H01L 29/786* (2006.01)
*H01L 27/12* (2006.01)
*H01L 49/02* (2006.01)

(52) U.S. Cl.
CPC ....... *G09G 3/3677* (2013.01); *H01L 27/1225* (2013.01); *H01L 27/1248* (2013.01); *H01L 27/1255* (2013.01); *H01L 28/24* (2013.01); *H01L 29/7869* (2013.01);
(Continued)

(58) Field of Classification Search
CPC . G09G 3/3677; H01L 29/78696; H01L 28/24; H01L 27/1225; H01L 27/1248; H01L 27/1255
See application file for complete search history.

(56) References Cited

U.S. PATENT DOCUMENTS

| 7,224,353 | B2 | 5/2007 | Song et al. |
| 9,299,306 | B2 | 3/2016 | Ye et al. |
| 2002/0093102 | A1 | 7/2002 | Wendel et al. |

(Continued)

FOREIGN PATENT DOCUMENTS

| CN | 101582453 | 11/2009 |
| CN | 102257621 | 11/2011 |

(Continued)

OTHER PUBLICATIONS

"Office Action of China Counterpart Application", dated Apr. 14, 2020, p. 1-p. 10.

(Continued)

*Primary Examiner* — Shaheda A Abdin
(74) *Attorney, Agent, or Firm* — JCIPRNET

(57) ABSTRACT

A driving substrate includes a substrate, at least one active device, a resistor, a first passivation layer and a second passivation layer. The active device including an oxide semiconductor layer and the resistor coupled to the active device are disposed on the substrate. The first passivation layer covers the active device, wherein a portion of the first passivation layer directly contacts to the oxide semiconductor layer such that the oxide semiconductor layer has a first conductivity. The second passivation layer covers the first passivation layer and the resistor, wherein a portion of the second passivation layer directly contacts to the resistor such that the resistor has a second conductivity. The first conductivity is different from the second conductivity.

11 Claims, 3 Drawing Sheets

(52) U.S. Cl.
CPC ........... *H01L 29/78696* (2013.01); *G09G 2300/0408* (2013.01); *G09G 2300/0417* (2013.01)

(56) References Cited

U.S. PATENT DOCUMENTS

| | | | |
|---|---|---|---|
| 2002/0115272 A1* | 8/2002 | Sun | H01L 29/78609 438/488 |
| 2004/0097031 A1* | 5/2004 | Lee | H01L 21/26586 438/238 |
| 2008/0308796 A1* | 12/2008 | Akimoto | H01L 29/04 257/43 |
| 2009/0001881 A1* | 1/2009 | Nakayama | H01L 27/3248 313/504 |
| 2010/0059747 A1 | 3/2010 | Nakayama et al. | |
| 2010/0245335 A1* | 9/2010 | Kimura | G09G 3/3688 345/90 |
| 2014/0175436 A1* | 6/2014 | Yamazaki | H01L 27/1225 257/43 |
| 2014/0347588 A1 | 11/2014 | Hatsumi et al. | |
| 2015/0001526 A1 | 1/2015 | Huang et al. | |

FOREIGN PATENT DOCUMENTS

| | | |
|---|---|---|
| CN | 103367248 | 10/2013 |
| CN | 103474468 | 12/2013 |
| CN | 103904065 | 7/2014 |
| CN | 104200788 | 12/2014 |
| CN | 104576746 | 4/2015 |
| CN | 105140271 | 12/2015 |
| CN | 106164763 | 11/2016 |
| TW | 201207910 | 2/2012 |
| TW | 201503374 | 1/2015 |

OTHER PUBLICATIONS

"Notice of Allowance of China Counterpart Application," dated Jul. 6, 2021, p. 1-p. 5.

* cited by examiner

DRIVING SUBSTRATE AND DISPLAY APPARATUS

CROSS-REFERENCE TO RELATED APPLICATION

This application claims the priority benefit of Taiwan application serial no. 106136423, filed on Oct. 24, 2017. The entirety of the above-mentioned patent application is hereby incorporated by reference herein and made a part of this specification.

BACKGROUND OF THE INVENTION

1. Field of the Invention

The invention relates to a substrate and an electronic apparatus, and more particularly, relates to a driving substrate and a display apparatus including said driving substrate.

2. Description of Related Art

In general, an amorphous silicon (a-Si) thin film transistor (TFT) is prone to suffer issues like threshold voltage shifting and high off current in a high voltage operating environment. Also, because a molecular structure of amorphous silicon is arranged without order and directivity, an electron movement of a channel layer in the a-Si TFT will be affected accordingly to lower a carrier mobility. Upon comparison, an oxide semiconductor TFT has an excellent stability for enduring high voltage and a more preferable carrier mobility. That is why the oxide semiconductor TFT has the potential of becoming a driving device for a display apparatus in the high voltage operating environment.

However, despite the favorable characteristic for enduring high voltage, the oxide semiconductor TFT fails to endure high current (high temperature). Consequently, because of the poor capability for enduring high current, the oxide semiconductor TFT is prone to suffer damage in the high voltage operating environment, which then makes the display apparatus unusable. Accordingly, as a conventional approach, a current loading is usually reduced by enlarging a length of a channel layer for the oxide semiconductor TFT. However, what accompanied with such approach is an increase in parasitic capacitance, resulting in serious signal delay and higher power consumption.

SUMMARY OF THE INVENTION

The invention provides a driving substrate having a resistor coupled to an active device, which is capable of effectively preventing the active device from burning out due to high current loading inside the active device while solving issues of signal delay and high power consumption caused by parasitic capacitance.

The invention provides a display apparatus including the driving substrate described above, which can provide a more preferable stability and a longer lifetime.

The driving substrate of the invention includes a substrate, at least one active device, a resistor, a first passivation layer and a second passivation layer. The active device is disposed on the substrate and includes an oxide semiconductor layer. The resistor is disposed on the substrate and coupled to the active device. The first passivation layer covers the active device, wherein a portion of the first passivation layer directly contacts to the oxide semiconductor layer such that the oxide semiconductor layer has a first conductivity. The second passivation layer covers the first passivation layer and the resistor, wherein a portion of the second passivation layer directly contacts to the resistor such that the resistor has a second conductivity. The first conductivity is different from the second conductivity.

In an embodiment of the invention, the active device further includes a gate, a gate insulation layer, a source and a drain. The gate insulation layer is disposed between the gate and the oxide semiconductor layer. The source and the drain are disposed on a same side of the oxide semiconductor layer, and a portion of the oxide semiconductor layer is exposed between the source and the drain.

In an embodiment of the invention, the oxide semiconductor layer is located between the gate and the substrate. The source and the drain are located between the gate insulation layer and the substrate.

In an embodiment of the invention, the resistor is electrically connected in series with the resistor or the drain.

In an embodiment of the invention, an orthogonal projection of the first passivation layer on the substrate is not overlapping with an orthogonal projection of the resistor on the substrate.

In an embodiment of the invention, a material of the first passivation layer is different from a material of the second passivation layer.

In an embodiment of the invention, a material of the first passivation layer is a silicon oxide, and a material of the second passivation layer is a silicon nitride.

In an embodiment of the invention, a material of the oxide semiconductor layer is selected from an indium gallium zinc oxide, an indium zinc oxide, an indium oxide, a zinc oxide, an indium titanium oxide or a zinc titanium oxide.

In an embodiment of the invention, the resistor and the oxide semiconductor layer belong to a same layer.

The display apparatus of the invention includes a driving substrate and a display medium. The driving substrate includes a substrate, at least one active device, a resistor, a first passivation layer and a second passivation layer. The active device is disposed on the substrate and includes an oxide semiconductor layer. The resistor is disposed on the substrate and coupled to the active device. The first passivation layer covers the active device, wherein a portion of the first passivation layer directly contacts to the oxide semiconductor layer such that the oxide semiconductor layer has a first conductivity. The second passivation layer covers the first passivation layer and the resistor, wherein a portion of the second passivation layer directly contacts to the resistor such that the resistor has a second conductivity. The first conductivity is different from the second conductivity. The display medium is disposed on the driving substrate.

In an embodiment of the invention, the active device further includes a gate, a gate insulation layer, a source and a drain. The gate insulation layer is disposed between the gate and the oxide semiconductor layer. The source and the drain are disposed on a same side of the oxide semiconductor layer, and a portion of the oxide semiconductor layer is exposed between the source and the drain.

In an embodiment of the invention, the resistor is electrically connected in series with the resistor or the drain.

In an embodiment of the invention, an orthogonal projection of the first passivation layer on the substrate is not overlapping with an orthogonal projection of the resistor on the substrate.

In an embodiment of the invention, a material of the first passivation layer is different from a material of the second passivation layer.

In an embodiment of the invention, a material of the oxide semiconductor layer is selected from an indium gallium zinc oxide, an indium zinc oxide, an indium oxide, a zinc oxide, an indium titanium oxide or a zinc titanium oxide.

In an embodiment of the invention, the display medium includes an electrophoretic display film or an electrowetting display film.

In an embodiment of the invention, the display apparatus further includes a planarization layer, which is disposed between the driving substrate and the display medium.

Based on the above, it is given that the active device of the driving substrate is coupled to the resistor in the invention. Also, the first passivation layer directly contacts to the oxide semiconductor layer such that the oxide semiconductor layer has the first conductivity, and the second passivation layer directly contacts to the resistor such that the resistor has the second conductivity. In this way, the current passing through the active device may be effectively limited to prevent the active device from burning out by the accompanied high current in high voltage operations. Moreover, parasitic capacitance of the active device may be minimized to solve the issues of signal delay and high power consumption.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
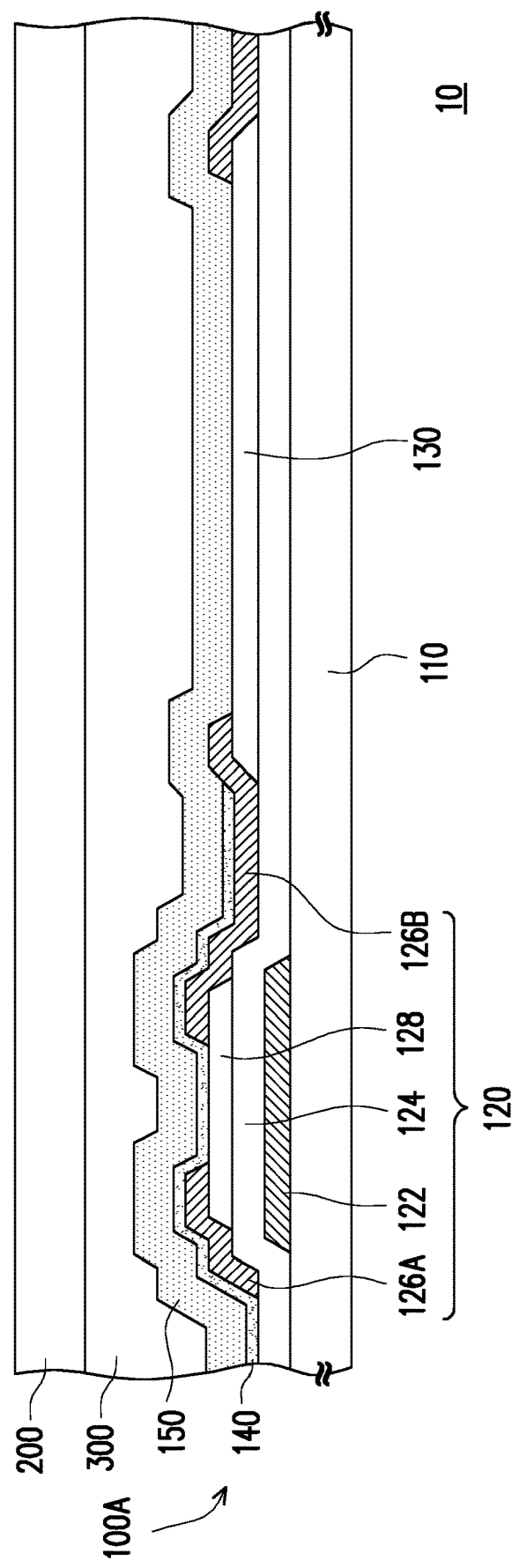
FIG. 1A illustrates a partial cross-sectional view of a display apparatus in an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Figure 1B:
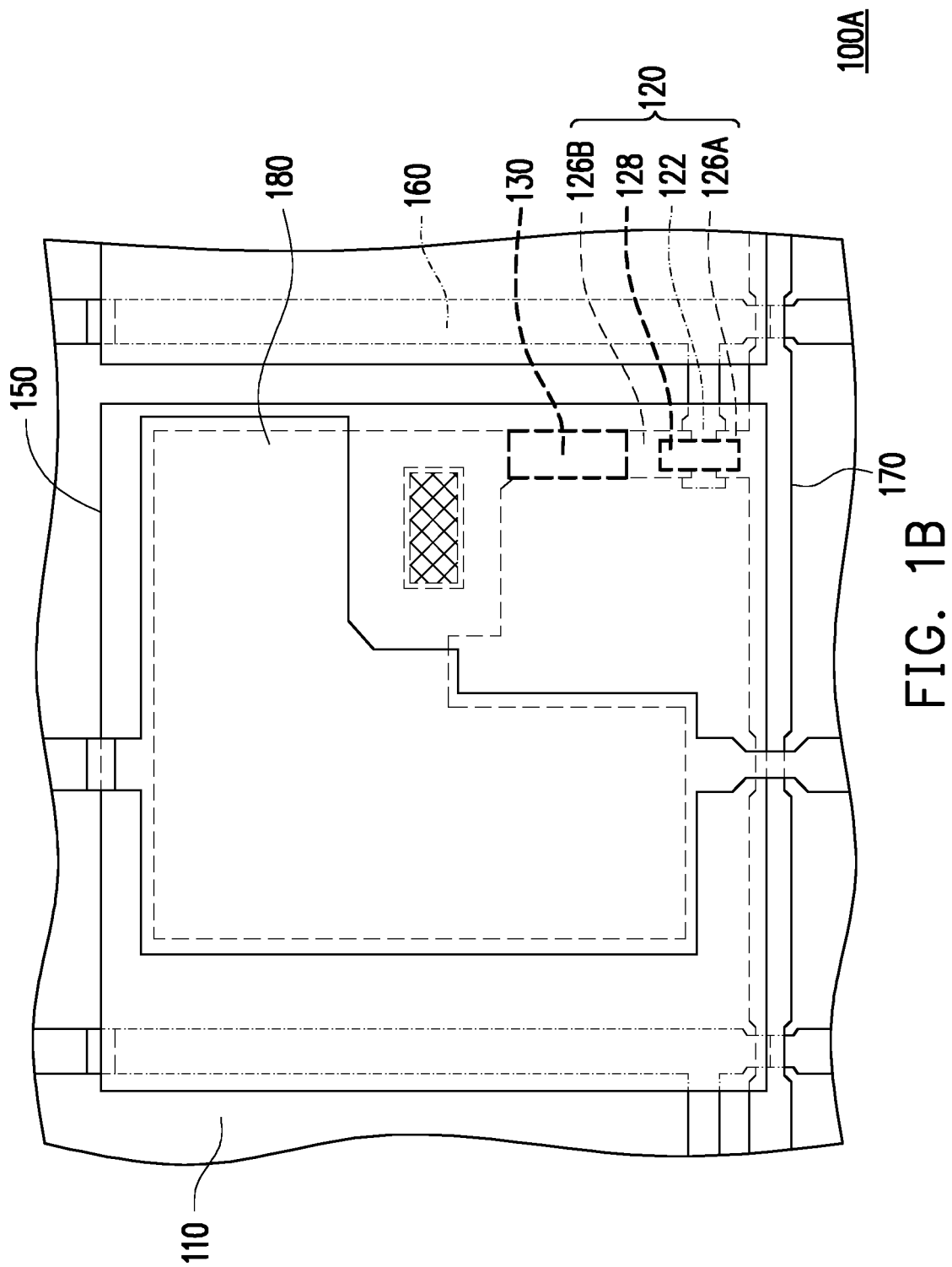
FIG. 1B illustrates a top view of a driving substrate of FIG. 1A.

FIG. 1A illustrates a partial cross-sectional view of a display apparatus in an embodiment of the invention. FIG. 1B illustrates a top view of a driving substrate of FIG. 1A. With reference to FIG. 1A, a display apparatus 10 of the present embodiment includes a driving substrate 100A and a display medium 200. The display medium 200 is disposed on the driving substrate 100A. Herein, the display medium 200 is, for example, an electrophoretic display film or an electrowetting display film, but not limited thereto. As shown in FIG. 1A, the display apparatus 10 of the present embodiment may further include a planarization layer 300, which is disposed between the driving substrate 100A and the display medium 200 and configured to flatten the driving substrate 100A.

In detail, referring to FIG. 1A and FIG. 1B together, the driving substrate 100A of the display apparatus 10 of the present embodiment includes a substrate 110, at least one active device 120 (only one of which is schematically depicted in FIG. 1A and FIG. 1B), a resistor 130, a first passivation layer 140 and a second passivation layer 150. The active device 120 is disposed on the substrate 110 and includes an oxide semiconductor layer 128. The resistor 130 is disposed on the substrate 110 and coupled to the active device 120, wherein the resistor 130 and the oxide semiconductor layer 128 belong to a same layer. The first passivation layer 140 covers the active device 120, wherein a portion of the first passivation layer 140 directly contacts to the oxide semiconductor layer 128 such that the oxide semiconductor layer 128 has a first conductivity. The second passivation layer 150 covers the first passivation layer 140 and the resistor 130, wherein a portion of the second passivation layer 150 directly contacts to the resistor 130 such that the resistor 130 has a second conductivity. A material of the first passivation layer 140 is different from a material of the second passivation layer 150, and the first conductivity is different from the second conductivity.

As shown in FIG. 1A and FIG. 1B, the active device 120 of the present embodiment includes a gate 122, a gate insulation layer 124, a source 126A and a drain 126B. The gate insulation layer 124 is disposed between the gate 122 and the oxide semiconductor layer 128. The source 126A and the drain 126B are disposed on a same side of the oxide semiconductor layer 128, and a portion of the oxide semiconductor layer 128 is exposed between the source 126A and the drain 126B. Specifically, the gate 122 and the gate insulation layer 124 are sequentially disposed on the substrate 110, and the gate insulation layer 124 completely covers the gate 122 and the substrate 110. The oxide semiconductor layer 128 and the resistor 130 are the same layer and disposed on the gate insulation layer 124. In other words, an orthogonal projection of the oxide semiconductor layer 128 on the substrate 110 is not overlapping with an orthogonal projection of the resistor 130 on the substrate 110. Herein, materials of the oxide semiconductor layer 128 and the resistor 130 may be selected from an indium gallium zinc oxide, an indium zinc oxide, an indium oxide, a zinc oxide, an indium titanium oxide or a zinc titanium oxide, but not limited thereto.

Furthermore, the source 126A and the drain 126B of the active device 120 respectively and partially cover portions of the oxide semiconductor layer 128 and oppositely extend and cover onto the gate insulation layer 124. A spacing is provided between the source 126A and the drain 126B above the oxide semiconductor layer 128 such that a portion of the oxide semiconductor layer 128 is exposed between the source 126A and the drain 126B. Herein, the drain 126B extends to the resistor 130 and the drain 126B is electrically connected in series with the resistor 130, but not limited thereto. In other embodiments not illustrated, it is also possible that the resistor is electrically connected in series with the source, and such configuration also falls in the scope of the invention for which protection is sought. In view of the disposition for the gate 122, the gate insulation layer 124, the source 126A and the drain 126B of the present embodiment, it can be known that the active device 120 of the present embodiment is embodied as a bottom-gate TFT, but not limited thereto.

Further, the first passivation layer 140 of the driving substrate 100A covers the source 126A and the drain 126B of the active device 120 and the oxide semiconductor layer 128 exposed between the source 126A and the drain 126B, wherein portion of the first passivation layer 140 directly contacts to the oxide semiconductor layer 128 such that the oxide semiconductor layer 128 has a first conductivity. The second passivation layer 150 covers the first passivation layer 140 and the resistor 130, wherein a portion of the second passivation layer 150 directly contacts to the resistor 130 such that the resistor 130 has a second conductivity. In particular, a material of the first passivation layer 140 is different from a material of the second passivation layer 150, and the first conductivity is different from the second conductivity. Herein, a material of the first passivation layer 140 is, for example, a silicon oxide and a material of the second passivation layer 150 is, for example, a silicon nitride, but not limited thereto.

It should be noted that, although the oxide semiconductor layer 128 of the active device 120 and the resistor 130 belong to the same layer, based on the different materials of the passivation layers above the oxide semiconductor layer 128 and the resistor 130, the oxide semiconductor layer 128 and the resistor 130 can have different electrical conductivities. For instance, because the oxide semiconductor layer 128 directly contacts to the first passivation layer 140 (e.g., the silicon oxide), the oxide semiconductor layer 128 has the first conductivity. Herein, a resistance of the active device 120 is, for example, $10^6$ to $10^{13}\Omega$. In addition, the resistor 130 directly contacts to the second passivation layer 150 (e.g., the silicon nitride) such that the resistor 130 has the second conductivity. Herein, a resistance of the resistor 130 is, for example, $1.6 \times 10^5 \Omega$. As a common knowledge, the resistance is inversely proportional to the conductivity, and thus the second conductivity is greater than the first conductivity in the present embodiment. Accordingly, the resistor 130 may be regarded as a current-limiting resistor.

It is given that the high voltage operating environment is bound to be accompanied by high current. However, with the active device 120 and the resistor 130 electrically connected in series in the present embodiment to increase a total resistance in circuit, the current passing through the active device 120 may be reduced to prevent the active device 120 from burning out due to high current loading. Further, given that the current passing through the active device 120 is reduced by the resistor 130 in the present embodiment, in comparison with the conventional approach of reducing the current loading by enlarging the length of the channel layer of the oxide semiconductor TFT, the present embodiment can prevent generation of parasitic capacitance caused by the channel layer being disposed in large-scale for reducing the passing-through high current.

Figure 2:
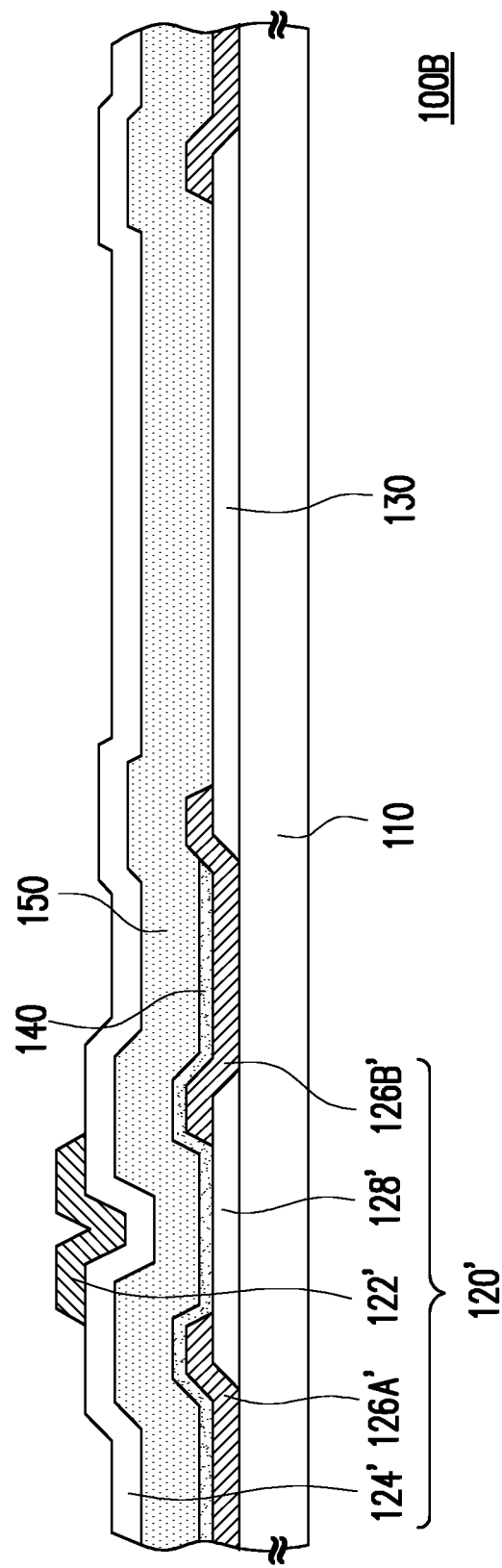
FIG. 2 illustrates a partial cross-sectional view of a driving substrate in another embodiment of the invention.

It is noted that, a structure type of the active device 120 is not particularly limited in the invention. Although the active device 120 is embodied as the bottom-gate TFT in the foregoing embodiment, in another embodiment with reference to FIG. 2, an oxide semiconductor layer 128' of a driving substrate 100B is located between a gate 122' and the substrate 110, and a source 126A' and a drain 126B' are located between an gate insulation layer 124' and the substrate 110. In other words, in view of the disposition for the gate 122', the gate insulation layer 124', the source 126A' and the drain 126B', it can be known that an active device 120' of the present embodiment is embodied as a top-gate TFT, such configuration also falls in the scope of the invention for which protection is sought.

In addition, referring to FIG. 1A and FIG. 1B together again, the driving substrate of the present embodiment further includes a plurality of scan lines 160, a plurality of data lines 170 and a plurality of pixel electrodes 180. Each of the pixel electrodes 180 is electrically connected to the corresponding scan line 160 and the corresponding data line 170 through the active device 120. In other words, the pixel electrode 180 is electrically connected to the active device 120, and the active device 120 is electrically connected to the corresponding scan line 160 and the corresponding data line 170. In the embodiments of the invention, the scan line 160 is coupled to the gate 122 of the active device 120, the data line 170 is coupled to the source 126A of the active device 120, and the pixel electrode 180 is coupled to the drain 126B of the active device. However, the invention is not limited thereto. In other embodiments not illustrated, it is also possible that the data line is coupled to the drain of the active device and the pixel electrode is coupled to the source of the active device.

In summary, it is given that the active device of the driving substrate of the invention is electrically connected in series with the resistor, and the resistor and the oxide semiconductor layer of the active device belong to the same layer. Also, the first passivation layer directly contacts to the oxide semiconductor layer such that the oxide semiconductor layer has the first conductivity, and the second passivation layer directly contacts to the resistor such that the resistor has the second conductivity. In this way, the current passing through the active device may be effectively limited to prevent the active device from burning out by the accompanied high current in high voltage operations. Moreover, parasitic capacitance of the active device may be minimized to solve the issues of signal delay and high power consumption. In addition, the display apparatus adopting the driving substrate of the invention can provide the more preferable stability and the longer lifetime.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A driving substrate, comprising:
a substrate;
at least one active device, disposed on the substrate and comprising an oxide semiconductor layer, a source, a drain, a gate, and a gate insulation layer, disposed between the gate and the oxide semiconductor layer, wherein the source and the drain are disposed on a same side of the oxide semiconductor layer, and a portion of the oxide semiconductor layer is exposed between the source and the drain;
a resistor, disposed on the substrate and coupled to the at least active device, wherein the source or the drain extends to the resistor, and the source or the drain is electrically connected in series with the resistor;
a first passivation layer, covering a source region and a drain region of the at least one active device, wherein a portion of the first passivation layer directly contacts to the oxide semiconductor layer such that the oxide semiconductor layer has a first conductivity; and
a second passivation layer, covering the first passivation layer and the resistor, wherein a portion of the second passivation layer directly contacts to the resistor such that the resistor has a second conductivity, and the first conductivity is different form the second conductivity,
wherein an orthogonal projection of the first passivation layer on the substrate is not overlapping with an orthogonal projection of the resistor on the substrate.
2. The driving substrate as recited in claim 1, wherein the oxide semiconductor layer is located between the gate and the substrate, and the source and the drain are located between the gate insulation layer and the substrate.

3. The driving substrate as recited in claim 1, wherein a material of the first passivation layer is different from a material of the second passivation layer.

4. The driving substrate as recited in claim 1, wherein a material of the first passivation layer is a silicon oxide, and a material of the second passivation layer is a silicon nitride.

5. The driving substrate as recited in claim 1, wherein a material of the oxide semiconductor layer is selected from an indium gallium zinc oxide, an indium zinc oxide, an indium oxide, a zinc oxide, an indium titanium oxide or a zinc titanium oxide.

6. The driving substrate as recited in claim 1, wherein the resistor and the oxide semiconductor layer belong to a same layer.

7. A display apparatus, comprising:
   a driving substrate, comprising:
      a substrate;
      at least one active device, disposed on the substrate and comprising an oxide semiconductor layer, a source, a drain, a gate, and a gate insulation layer disposed between the gate and the oxide semiconductor layer, wherein the source and the drain are disposed on a same side of the oxide semiconductor layer, and a portion of the oxide semiconductor layer is exposed between the srouce and the drain;
      a resistor, disposed on the substrate and coupled to the at least one active device, wherein the source or the drain extends to the resistor, and the source or the drain is electrically connected in series with resistor;
      a first passivation layer, covering a source region and a drain region of the at least one active device, wherein a portion of the first passivation layer directly contacts to the oxide semiconductor layer such that the oxide semiconductor layer has a first conductivity, wherein an orthogonal projection of the first passivation layer on the substrate is not overlapping with an orthogonal projection of the resistor on the substrate; and
      a second passivation layer, covering the first passivation layer and the resistor, wherein a portion of the second passivation layer directly contacts to the resistor such that the resistor has a second conductivity, and the first conductivity is different from the second conductivity; and
   a display medium, disposed on the driving substrate.

8. The display apparatus as recited in claim 7, wherein a material of the first passivation layer is different from a material of the second passivation layer.

9. The display apparatus as recited in claim 7, wherein a material of the oxide semiconductor layer is selected from an indium gallium zinc oxide, an indium zinc oxide, an indium oxide, a zinc oxide, an indium titanium oxide or a zinc titanium oxide.

10. The display apparatus as recited in claim 7, wherein the display medium comprises an electrophoretic display film or an electrowetting display film.

11. The display apparatus as recited in claim 7, further comprising: a planarization layer, disposed between the driving substrate and the display medium.

* * * * *